(12) United States Patent
Jung et al.

(10) Patent No.: US 10,001,937 B2
(45) Date of Patent: Jun. 19, 2018

(54) MEMORY SYSTEM AND OPERATING METHOD THEREOF

(71) Applicant: SK hynix Inc., Gyeonggi-do (KR)

(72) Inventors: Won-Jin Jung, Gyeonggi-do (KR);
Ga-Ram Han, Gyeonggi-do (KR);
Keun-Woo Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/447,279

(22) Filed: Mar. 2, 2017

(65) Prior Publication Data
US 2018/0059971 A1 Mar. 1, 2018

(30) Foreign Application Priority Data
Aug. 25, 2016 (KR) ........................ 10-2016-0108092

(51) Int. Cl.
| | |
|---|---|
| *G11C 16/28* | (2006.01) |
| *G06F 3/06* | (2006.01) |
| *G11C 11/56* | (2006.01) |
| *G11C 16/04* | (2006.01) |
| *G11C 16/34* | (2006.01) |

(52) U.S. Cl.
CPC .......... *G06F 3/0619* (2013.01); *G06F 3/0634* (2013.01); *G06F 3/0659* (2013.01); *G06F 3/0679* (2013.01); *G11C 11/5628* (2013.01); *G11C 11/5635* (2013.01); *G11C 11/5642* (2013.01); *G11C 16/0483* (2013.01); *G11C 16/3459* (2013.01)

(58) Field of Classification Search
CPC .... G06F 3/0619; G06F 3/0634; G06F 3/0659; G06F 3/0679; G11C 11/5628; G11C 11/5635; G11C 11/5642; G11C 16/0483; G11C 16/3459
USPC .................................................... 365/185.09
See application file for complete search history.

(56) References Cited

U.S. PATENT DOCUMENTS

| | | | | |
|---|---|---|---|---|
| 7,773,415 | B2 | 8/2010 | Park et al. | |
| 8,976,592 | B2 * | 3/2015 | Park ........................ | G11C 16/28 365/185.17 |
| 2013/0279250 | A1 * | 10/2013 | Park ........................ | G11C 16/28 365/185.03 |

* cited by examiner

*Primary Examiner* — Han Yang
*Assistant Examiner* — Xiaochun L Chen
(74) *Attorney, Agent, or Firm* — IP & T Group LLP

(57) ABSTRACT

A memory device may include: a memory cell array comprising a plurality of search regions, each of the search regions comprising a plurality of group regions, each of the group regions comprising a flag cell, each flag cell comprising information indicating whether the corresponding group region is programmed; a voltage generator suitable for generating a read bias voltage for the memory cell array according to a voltage control signal; and a memory controller suitable for selecting a search region and controlling the voltage generator to adjust the read bias voltage based on information of flag cell of the selected search region when a read command is received, and controlling a read operation for the selected search region based on the adjusted read bias voltage.

20 Claims, 15 Drawing Sheets

MEMORY SYSTEM AND OPERATING METHOD THEREOF

CROSS-REFERENCE TO RELATED APPLICATIONS

The present application claims priority of Korean Patent Application No. 10-2016-0108092, filed on Aug. 25, 2016, which is incorporated herein by reference in its entirety.

BACKGROUND

1. Field

Exemplary embodiments of the present invention relate to a memory system and, more particularly, to a memory system which processes data to a memory device and an operation method thereof.

2. Description of the Related Art

Recently, the paradigm of the computer environment is changed into a ubiquitous computing environment which allows users to get an access to a computer system anywhere and anytime. For this reason use of portable electronic devices, such as mobile phones, digital cameras laptop computers and the like, is surging. Portable electronic devices generally employ a memory system using a memory device for storing data, i.e., is a data storage device. A data storage device may be used as a main memory device or an auxiliary memory device of a portable electronic device.

A data storage device using a memory device has excellent stability and durability because the data storage device does not include a mechanical driving unit. Also, the data storage device using a memory device is advantageous in that it may access data quickly and consume a small amount of power. Non-limiting examples of the data storage device having these advantages include a Universal Serial Bus (USB) memory device, a memory card with various interfaces, a Solid-State Drive (SSD) and so forth.

With the development of technology, high density/high capacity memory devices have been developed which employ an increased number of word lines (WL). When all word lines in a memory device are not filled with data, for example, when parts of word lines have no data programmed therein, the distribution characteristic of memory cells in the memory device may be changed and may distort a read bias.

SUMMARY

Various embodiments are directed to a memory system capable of grouping word lines of a memory device into a plurality of groups and adjusting a read bias depending on the amount (or ratio) of data programmed in each of the word line groups, and an operating method thereof.

In an embodiment a memory device may include: a memory cell array comprising a plurality of search regions, each of the search regions comprising a plurality of group regions, each of the group regions comprising a flag cell, each flag cell comprising information indicating whether the corresponding group region is programmed; a voltage generator suitable for generating a read bias voltage for the memory cell array according to a voltage control signal; and a memory controller suitable for selecting a search region and controlling the voltage generator to adjust the read bias voltage based on information of flag cell of the selected search region when a read command is received, and controlling a read operation for the selected search region based on the adjusted read bias voltage.

In an embodiment, a memory system may include: a memory device; and a controller coupled to the memory device, and suitable for enabling a flag cell read operation for an open block of the memory device during a read mode. The memory device may include: a memory cell array comprising a plurality of search regions, wherein each of the search regions comprises a plurality of group regions, and each of the group regions comprises a flag cell indicating whether program is completed; a voltage generator suitable for generating a read bias voltage for the memory cell array according to a voltage control signal; and a memory controller suitable for checking that a flag cell read operation is enabled when a read command is received, generating the voltage control signal for an adjusted read bias voltage based on flag cell information of the corresponding search region among the plurality of search regions when the flag cell read operation is enabled, and controlling a read operation for the memory cell array based on the adjusted read bias voltage.

In an embodiment, there is provided an operating method of a memory device which includes a memory cell array including a plurality of search regions, wherein each of the search regions comprises a plurality of group regions and each of the group regions comprises a flag cell indicating whether the corresponding group region is programmed. The operating method may include: receiving a read command; adjusting a read bias voltage of a corresponding search region, based on flag cell information of the group regions of the search region; and controlling a read operation for the memory cell array based on the read bias voltage.

In an embodiment, an operating method of a memory system may include: checking block information during a read mode, enabling a flag cell read operation for an open block of a memory device, and generating a read command; generating a read bias voltage which is adjusted based on flag cell information of a corresponding search region of a memory cell array, when the read command is generated and the flag cell read operation is enabled, and controlling a read operation for the memory cell array based on the read bias voltage. The memory cell array may include a plurality of search regions each of the search regions may include a plurality of group regions, and each of the group regions may include a flag cell indicating whether program is completed.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
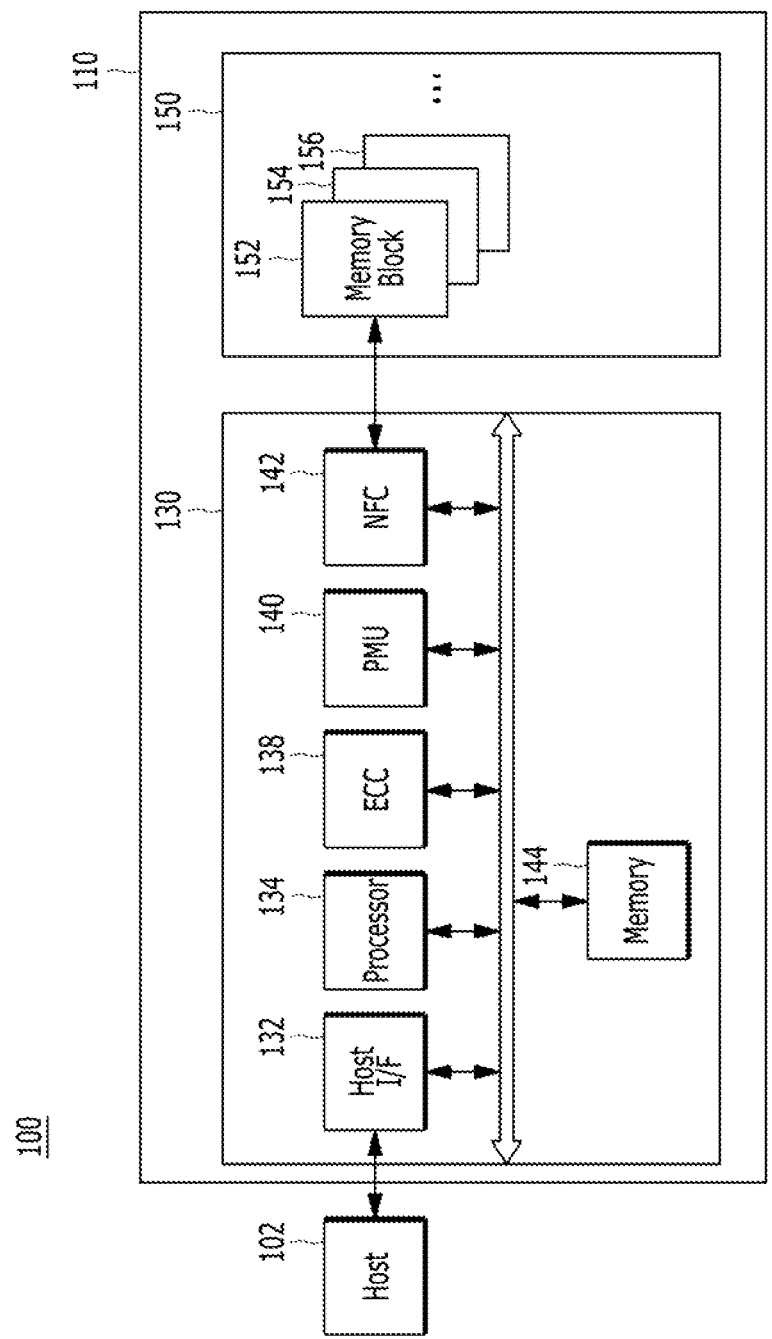
FIG. 1 is a block diagram illustrating an example of a data processing system including a memory system, in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that the drawings are simplified schematic and as such are not necessarily drawn to scale. In some instances, various parts of the drawings may have been exaggerated in order to more clearly illustrate certain features of the illustrated embodiments.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereafter, various embodiments will be described below in more detail with reference to the accompanying drawings.

FIG. 1 illustrates a data processing system 100 including a memory system, according to an embodiment of the present invention.

Referring to FIG. 1, the data processing system 100 may also include a host 102 operatively coupled to the memory system 110.

The host 102 may be any suitable electronic device. The host 102 may be or include, for example, a portable electronic device such as a mobile phone, an MP3 player and a laptop computer or a non-portable electronic device such as a desktop computer, a game player, a television (TV) and a projector.

The memory system 110 may operate in response to a request from the host 102. For example, the memory system 110 may store data provided by the host 102 and the memory system 110 may also provide stored data to the host 102. Data which are stored in the memory system may be accessed by the host 102. The memory system 110 may be used as a main memory or an auxiliary memory of the host 102. The memory system 110 may be implemented with any one of various storage devices, according to the protocol of a host interface to be coupled electrically with the host 102. The memory system 110 may be implemented with any one of various storage devices such as, for example, a solid state drive (SSD), a multimedia card (MMC), an embedded MMC (eMMC), a reduced size MMC (RS-MMC), a micro-MMC a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices forming the memory system 110 may be implemented with a volatile memory device, such as a dynamic random access memory (DRAM) and a static random access memory (SRAM) or a nonvolatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM) and a flash memory.

The memory system 110 may include a memory device 150 and a controller 130. The memory device 150 may store data which may be accessed by the host 102. The controller 130 may control data exchange between the memory device 150 and the host 102. For example, under the control of the controller 130, data received from the host 102 may be stored in the memory device 150 and stored data in the memory device 150 may be read and transmitted to the host 102.

The controller 130 an the memory device 150 may be integrated into one semiconductor device. For instance, the controller 130 and the memory device 150 may be integrated into one semiconductor device to form a solid state drive (SSD). When the memory system 110 is used as an SSD, the operation speed of the host 102 that is electrically coupled with the memory system 110 may be significantly increased.

The controller 130 and the memory device 150 may be integrated into one semiconductor device to form a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

In another instance, the memory system 110 may be or may be included in a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage for a data center, a device capable of transmitting and receiving information under a wireless environment, one of various electronic devices for a home network, one of various electronic devices for a computer network, one of various electronic devices for a telematics network, an RFID device, or one of various component elements for a computing system.

The memory device 150 may retain stored data even when power is blocked, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells which are electrically coupled to a word line (WL). The memory cells may be single bit cells or multi-bit cells. The memory cells may be arranged in a two or three dimensional stacked structure. The memory device 150 may be a nonvolatile memory device, for example, a flash memory. The flash memory may have a three-dimensional (3D) stack structure. An exemplary configuration of the memory device 150 and an exemplary three-dimensional (3D) stack structure of the memory device 150 will be described later in detail with reference to FIGS. 2 to 4.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control the overall operations of the memory device 150 including operations such as read, write program, and erase operations.

For example, the controller 130 may include a host interface (I/F) unit 132, a processor 134, an error correction code (ECC) unit 138, a power management unit (PMU) 140, a NAND flash controller (NFC) 142, and a memory 144.

The host interface unit 132 may process commands and data provided from the host 102, and may communicate with the host 102 through at least one of various interface protocols such as universal serial bus (USB), multimedia card (MMC), peripheral component interconnect express (PCI-e), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than a threshold number of correctable error bits, and may output an error correction fail signal indicating failure in correcting the error bits.

The ECC unit 138 may perform an error correction operation based on any suitable method including a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory. It is noted that a different memory interface may be employed depending upon the type of memory device employed.

The memory 144 may serve as a working memory of the memory system 110 and the controller 130. The memory 144 may store data for driving the memory system 110 and the controller 130. The controller 130 may control the memory device 150 in response to a request from the host 102. For example, the controller 130 may provide data read from the memory device 150 to the host 102 and store the data provided from the host 102 in the memory device 150. When the controller 130 controls an operation of the memory device 150 such as, for example, a read, write, program and erase operation, the memory 144 may store data which are used by the controller 130 and the memory device 150 for the operation.

The memory 144 may be implemented with a volatile memory such as, for example, a static random access memory (SRAM) or a dynamic random access memory (DRAM). As described above the memory 144 may store data used by the host 102 and the memory device 150 for an operation including a read and a write operation. For storing the data, the memory 144 may include a program memory, a data memory, a write buffer, a read buffer, a map buffer, and the like.

The processor 134 may control the general operations of the memory system 110, and a write operation or a read operation for the memory device 150, in response to a write request or a read request received from the host 102, respectively. For example, the processor 134 may drive firmware, which is referred to as a flash translation layer (FTL), to control the general operations of the memory system 110. The processor 134 may be implemented, for example, with a microprocessor or a central processing unit (CPU).

A management unit (not shown) may be included in the processor 134 for performing bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during a program operation, due to characteristics of a NAND logic function. During the bad block management, the data of the program-failed memory block or the bad memory block may be programmed into a new memory block. Bad blocks due to program fails may seriously deteriorate the utilization efficiency of a 3D stack structure memory device 150 and the reliability of the memory system 100, and thus reliable bad block management is typically employed. Bad block management is well known in the art and hence it will not be described herein in any further detail.

Figure 2:
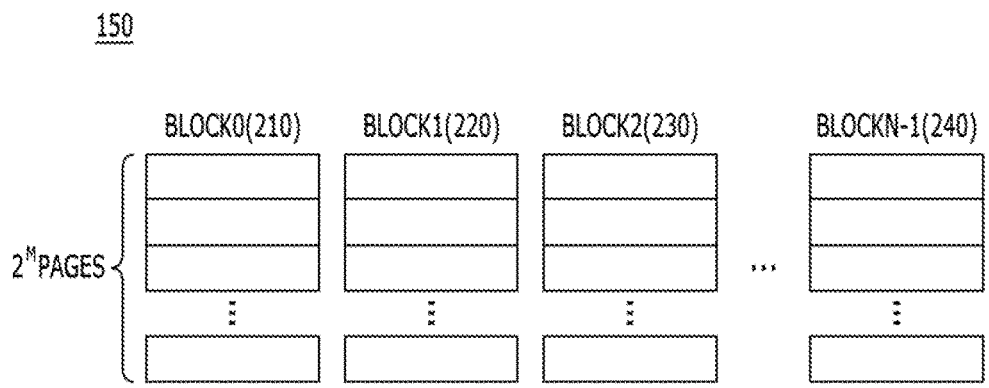
FIG. 2 illustrates a memory device in a memory system, in accordance with an embodiment of the present invention.

FIG. 2 is a diagram illustrating an exemplary configuration of the memory device 150 shown in FIG. 1.

Referring to FIG. 2, the memory device 150 may include a plurality of memory blocks. For example, the memory device 150 may include a zeroth memory block (BLOCK0) 210, a first memory block (BLOCK1) 220, a second memory block (BLOCK2) 230 and an N-1$^{th}$ memory block (BLOCKN-1) 240. Each of the memory blocks 210 to 240 may include a plurality of pages, for example, 2$^M$ number of pages ($2^M$ PAGES). Each of the pages may include a plurality of memory cells which are electrically coupled to a word line.

Also, the memory device 150 may include a plurality of memory blocks, as single level cell (SLC) memory blocks and/or multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, plurality-bit data. An MLC memory block including a plurality of pages which are implemented with memory cells that are each capable of storing 3-bit data may also be referred to as a triple level cell (TLC) memory block.

Each of the memory blocks 210 to 240 may store the data provided from the host 102 during a write operation, and provide the stored data to the host 102 during a read operation.

Figure 3:
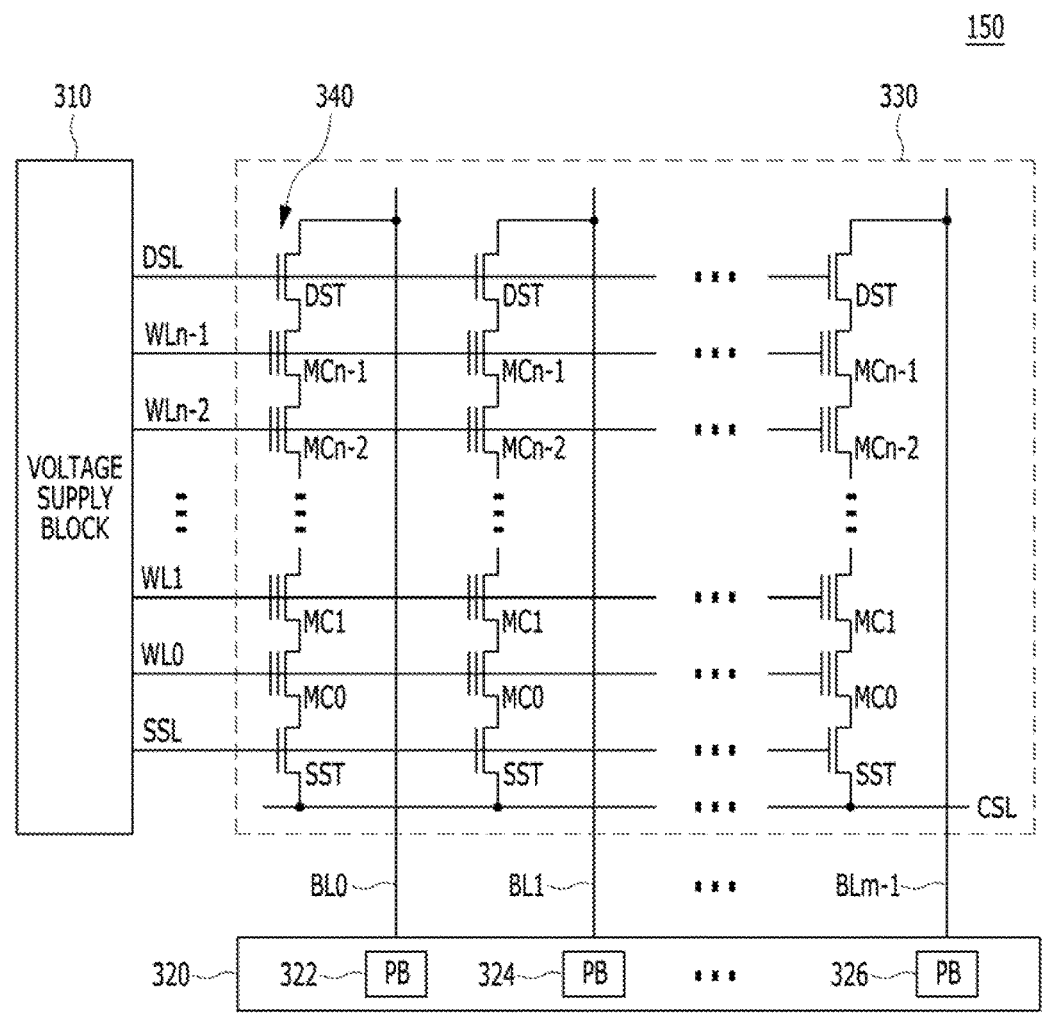
FIG. 3 is a diagram illustrating a memory cell array circuit of memory blocks in a memory device, in accordance with an embodiment of the present invention.

FIG. 3 is a diagram illustrating a memory device 150 including the memory block shown in FIG. 2. For example, FIG. 3 shows a detailed configuration of a single memory block 330 of the memory device 150 and circuits 310 and 320 related thereto.

Referring to FIG. 3, the memory block 330 may include a plurality of cell strings 340 which are electrically coupled to a plurality of corresponding bit lines BL0 to BLm−1, respectively. The cell string 340 of each column may include at least one drain select transistor DST and at least one source select transistor SST. A plurality of memory cell transistors MC0 to MCn−1 may be electrically coupled in series between the select transistors SST and DST. The respective memory cells MC0 to MCn−1 may be configured by multi-level cells (MLC) each of which stores data information of a plurality of bits. For reference, in FIG. 3, 'DSL' denotes a drain select line (i.e., a string select line), 'SSL' denotes a source select line (i.e., a ground select line), and 'CSL' denotes a common source line.

While FIG. 3 shows, as an example, the memory block 330 which is configured by NAND flash memory cells, it is to be noted that the memory block 330 of the memory device 300 is not limited to NAND flash memory. For example, the memory block 330 may also be realized by a NOR flash memory, a hybrid flash memory in which at least two kinds of memory cells are combined, or a one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 300 may provide word line voltages, for example, a program voltage, a read voltage and a pass voltage, to be supplied to respective word lines according to an operation mode and voltages to be supplied to bulks, for example, well regions, where the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 300 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers (PBs) 322, 324 and 326 respectively corresponding to columns (or bit lines) or pairs of columns (or pairs of bit lines), and a plurality of latches (not shown) may be included in each of the page buffers 322, 324 and 326.

The memory device 150 may be realized as a 2-dimensional or 3-dimensional memory device. For example, as shown in FIG. 4, in the case here the memory device 150 is realized as a 3-dimensional nonvolatile memory device, the memory device 150 may include a plurality of memory blocks BLK0 to BLKN−1.

Figure 4:
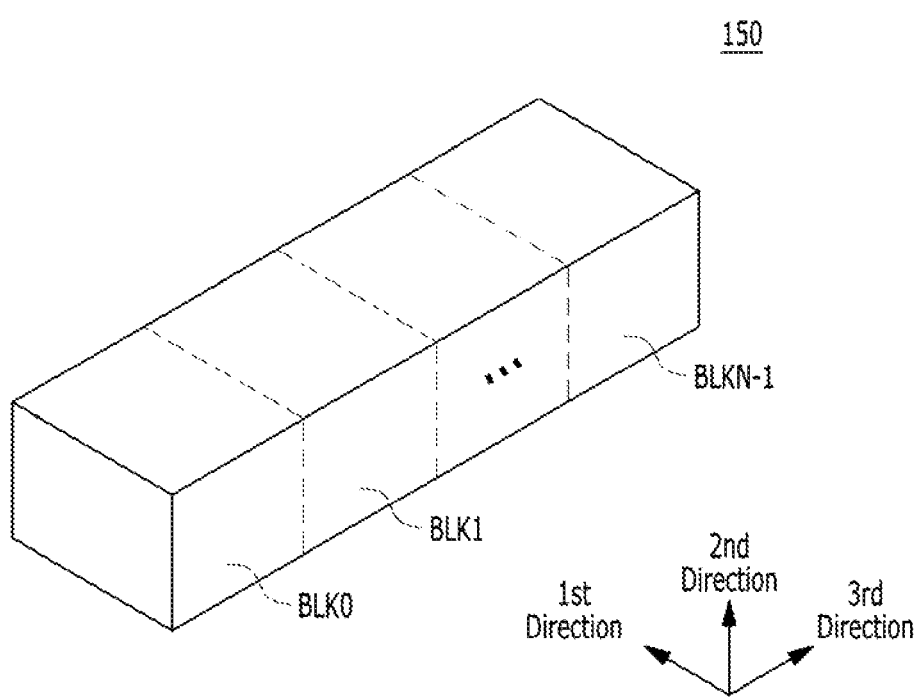
FIG. 4 illustrates a structure of a memory device in a memory system, in accordance with an embodiment of the present invention.

FIG. 4 is a diagram illustrating the memory blocks BLK0 to BLKN−1 of the memory device 150 shown in FIG. 3, realized as a 3-dimensional structure (or a vertical structure). For example, the respective memory blocks BLK0 to BLKN−1 may be realized as a 3-dimensional structure by including a structure which extends in first to third directions (for example, the x-axis direction the y-axis direction and the z-axis direction).

The respective memory blocks BLK0 to BLKN−1 may include a plurality of NAND strings extending in the second direction. The plurality of NAND strings may be provided in the first direction and the third direction. Each NAND string may be electrically coupled to a bit line, at least one drain select line, at least one source select line, a plurality of word lines, at least one dummy word line, and a common source line. Namely, the respective memory blocks BLK0 to BLKN−1 may be electrically coupled to a plurality of bit lines, a plurality of drain select lines, a plurality of source select lines, a plurality of word lines, a plurality of dummy word lines, and a plurality of common source lines.

Figure 5:
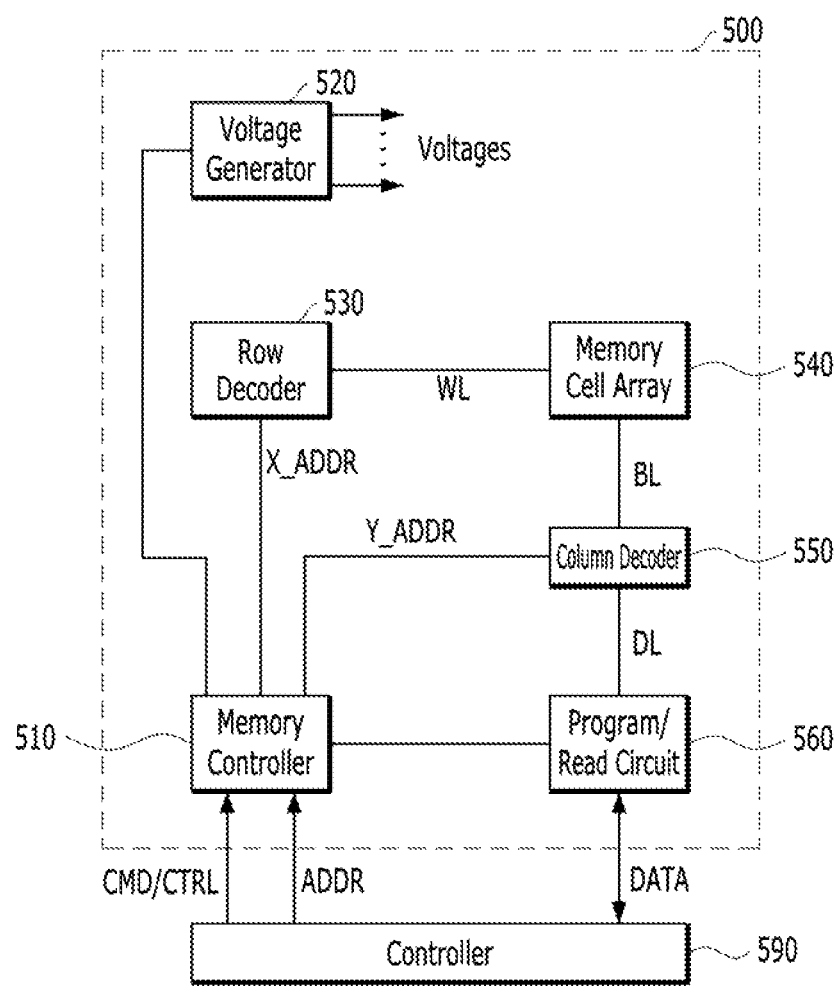
FIG. 5 is a diagram illustrating the configuration of a memory system, in accordance with an embodiment of the present invention.

FIG. 5 is a diagram illustrating the configuration of a memory system, in accordance with an embodiment of the present invention.

Referring to FIG. 5, the memory system may include a memory device 500 operatively coupled to a controller 590. The memory device 500 may include a memory controller 510, a voltage generator 520, a row decoder 530, a memory cell array 540, a column decoder 550 and a program/read circuit 560.

In an embodiment, the controller 590 may serve as a controller of an electronic device hosting the memory device. The electronic device may be any suitable electronic device. The electronic device may be or include one or more of a smart phone, tablet PC, mobile phone, video phone, E-book reader, desktop PC, laptop PC, netbook computer, workstation, server, Personal Data Assistant (PDA), Portable Multimedia Player (PMP), PM3 player, medical device, camera and wearable device.

In accordance with an embodiment, the controller 590 may include a Solid State Drive (SSD) coupled to a host device. The host device may be or include any suitable electronic device. In an embodiment, the controller 590 and the memory device 500 may be an SSD operatively coupled to a suitable electronic device. The SSD may be coupled permanently or removably to the electronic device.

The memory cell array 540 of the memory device 500 include a plurality of memory cells arranged at the respective intersections of a plurality of word lines WL and a plurality of bit lines BL. The memory device 500 may receive an address ADDR with a command CMD, the address ADDR indicating a memory cell to be accessed. The address ADDR may include information which the memory controller 510 may employ for generating a row address X_ADDR for selecting a word line WL of the memory cell array 540 and a column address Y_ADDR for selecting a bit line BL of the memory cell array 540.

The memory cell array 540 may include a plurality of search regions each including plurality group regions, and each of the group regions may have a flag cell allocated thereto, the flag cell indicating whether or not the corresponding group region is completely programmed. In an embodiment, the memory device 500 may adjust a read bias voltage for each of the search regions. That is, the search region may correspond to a unit region by which a read bias of the memory device 500 can be adjusted. In an embodiment, the search region may correspond to a block. Each search region (for example each block) may include a plurality of group regions of which each is set by grouping a plurality of word lines included in the search region. A flag cell for each group region may be allocated to a specific position of the group region. In an embodiment, a group region may have a larger area than a page, and the flag cell of the group region may be allocated to the last word line of the group region. The flag cell of the group region may be set (or programmed) when the group region is completely programmed. In the following descriptions, the phrases setting, programming or writing of the flag cell will be used as having the same meaning. Furthermore resetting and erasing of the flag cell will be used as having the same meaning.

The row decoder 530 may be coupled to the memory cell array 540 through the word lines WL, and select one or more of the word lines WL in response to a row address X_ADDR received from the memory controller 510. The column decoder 550 may be coupled to the memory cell array 540 through the bit lines BL, and select one or more of the bit lines BL in response to a column address Y_ADDR received from the memory controller 510.

The program/read circuit 560 may program or write data DATA inputted from outside (e.g., the controller 590) to the memory cell array 540 or sense data programmed in the memory cell array 540 and output the sensed data to the controller 590, according to control of the memory controller 510. Furthermore, the program/read circuit 560 may provide a program or read result to the memory controller 510. For example, during a program operation, the program/read circuit 560 may perform a verification operation to detect a result of the program operation, and provide the verification result (for example, pass/fail (P/F) signal) to the memory controller 510. Furthermore, when a flag cell read operation is enabled during a read operation, the program/read circuit 560 may read flag cell information of the memory cell array 540 and provide the read information to the memory controller 510.

The program/read circuit 560 may include a program circuit and a read circuit. The program circuit may be coupled to a bit line BL selected through the column decoder 550, and perform a program operation (or write operation) by providing a program pulse to a selected memory cell of the memory cell array 540. The read circuit of the program/read circuit 560 may be coupled to a bit line BL selected through the column decoder 550, sense the level of a selected memory cell of the memory cell array 540, and read (or output) data stored in the selected memory cell. The read circuit of the program/read circuit 560 may output data read in the read mode to the outside of the memory device 500, for example the controller 590.

In an embodiment, the read circuit of the program/read circuit 560 may read the flag cell information of the memory cell array 540. When a read command is received from the controller 590 in a state where the flag cell read operation is enabled, the memory controller 510 may read the flag cell information through the read circuit of the program/read circuit 560. The flag cell information read from the program/read circuit 560 may be provided to the memory controller 510 and/or the controller 590.

The voltage generator 520 may generate various types of voltages for performing operations, such as program, read and erase operations on the memory cell array 540, based on a voltage control signal provided by the memory controller 510. Furthermore, the voltage generator 520 may generate driving voltages (or bias voltages) for driving the plurality of word lines WL and bit lines BL. For example, the driving voltages may include a set program voltage, a reset voltage, a read voltage and a cutoff voltage.

In an embodiment, the voltage generator 520 may generate and supply a read bias voltage having a corresponding level based on a voltage control signal of the memory controller 510 in the read mode. The voltage generator 520 may generate and supply a read bias voltage for a closed block or open block, under control of the memory controller 510. In order to supply a read bias voltage for an open block, the voltage generator 520 may generate a read bias voltage which is adjusted based on the number of programmed group regions in the open block (i.e., the amount of data programmed in the block), under control of the memory controller 510.

The memory controller 510 may output control signals for programming data to the memory cell array 540 or for reading data from the memory cell array 540, based on a command CMD, an address ADDR and a control signal CTRL which are received from the controller 590. The control signals outputted from the memory controller 510 may be provided to the voltage generator 520, the row decoder 530, the column decoder 550 and the program/read circuit 560. The memory controller 510 may control various operations in the memory device 500.

For example, the memory controller 510 may generate operation control signals based on the command CMD and the control signal CTRL, and provide the generated operation control signals to the program/read circuit 560. Furthermore, the memory controller 510 may provide a row address X_ADDR to the row decoder 530, and provide a column address Y_ADDR to the column decoder 550. The memory controller 510 may generate the voltage control signal based on the command CMD, the control signal CTRL and the P/F signal received from the read circuit of the program/read circuit 560. For example, the voltage control signal may include a signal indicating the operation mode of the memory device 500 and a signal for controlling the voltage levels of various voltages generated by the voltage generator 520. The memory controller 510 may provide the generated voltage control signal to the voltage generator 520.

In an embodiment, when a flag cell read enable signal is received from the controller 590, the memory controller 510 may read flag cell information of the memory cell array 540.

When a read command is received in a state where the flag cell read operation is enabled, the memory controller 510 may control the row decoder 530 and the column decoder 550 to designate a flag cell position in the memory cell array 540, and read flag cell information through the read circuit of the program/read circuit 560. The memory controller 510 may analyze the flag cell information outputted from the read circuit of the program/read circuit 560, and recognize a cell distribution of the memory cell array 540, for example, a distribution of programmed memory cells. The memory controller 510 may generate a voltage control signal for adjusting a read bias voltage according to the recognition result for the cell distribution, and provide the generated voltage control signal to the voltage generator 520. The voltage generator 520 may adjust the read bias voltage based on the received voltage control signal. Thus, the memory controller 510 may control a read operation of the memory cell array 540, based on the adjusted read bias voltage.

According to the recent trend, the number of word lines WL included in each block of a memory device (for example, a nonvolatile memory device or flash memory) is increasing. In this case, when all word lines WL included in the block are not filled, the distribution characteristic of a memory cell in the memory device may change and may distort a read bias. For example, in the case of an open block of which the cell distribution is changed, an offset of relative read throughput (RRT) which is set based on a closed block may not be harmonized with the open block.

In an embodiment, the memory system can internally change the read bias according to a distribution which is distorted depending on how much a block is filled. Thus, the memory system may set an optimized read bias regardless of the state (e.g., program state) of the block. For example, one block may be divided into a plurality of groups, and the read bias may be changed based on the number of programmed groups in a block to be read during a read operation. Under the supposition that the number of the plurality of groups is greater than four and a first read bias voltage is supplied to a closed block, the memory system may supply a second read bias when four groups are programmed in the block to be read, supply a third bias voltage when three groups are programmed, supply a fourth read bias voltage when two groups are programmed, and supply a fifth read bias voltage when one group is programmed. At this time, the first read bias voltage may have the highest level, and the fifth read bias voltage may have the lowest level.

In an embodiment, the memory system may supply a read bias voltage based on the state of a block (for example, closed block or open blocky during a read operation. For example, the memory system may supply a preset read bias voltage to a closed block, and supply to an open block a read bias voltage having a different level from the closed block. For example, the read bias voltage of the open block may have a lower level than the read bias voltage of the closed block.

In accordance with an embodiment, the memory system may supply one read bias voltage or a plurality of read bias voltages to an open block. For example, the memory system may supply a first read bias voltage to the closed block, and supply a second read bias voltage to the open block, the second read bias voltage having a lower level than the first read bias voltage. Furthermore, the memory system may divide the open block into one or more groups, and supply the read bias voltage to the groups. For example, under the supposition that the first read bias voltage is supplied to the closed block, the memory system may supply the second read bias voltage when three or four groups are programmed in a block to be read, and supply the third read bias voltage when one or two groups are programmed.

In an embodiment, the memory system may divide the word lines of the memory device 500 into group regions. Depending on how much each of the group regions is filled, the memory system may adjust the read bias for the memory device 500, thereby stabilizing a read operation.

Figure 6A:
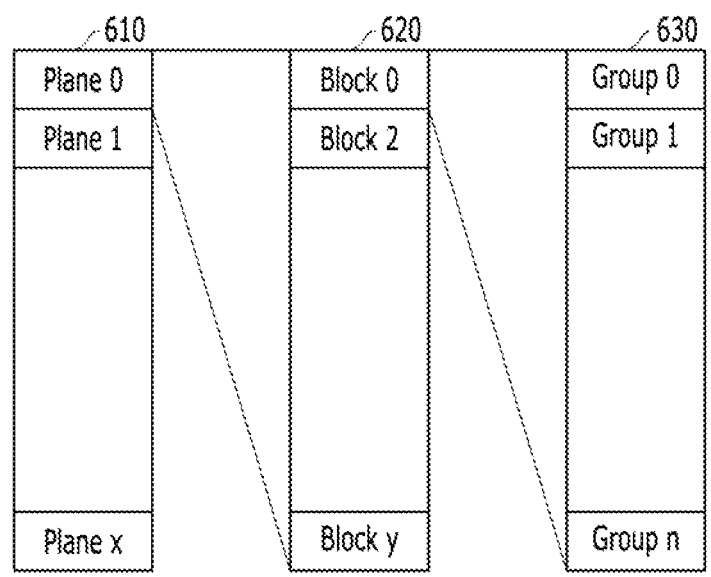
FIGS. 6A and 6B are diagrams illustrating the architecture of a memory device in the memory system, in accordance with the present embodiment.

FIGS. 6A and 66 are diagrams illustrating the architecture of the memory device, in accordance with an embodiment.

Referring to FIG. 6A, the memory cell array 540 of the memory device 500 in FIG. 5 may include a plurality of dies, each of the dies may include a plurality of planes plane 0 to plane x as indicated by 610 in FIG. 6A, and each of the planes may include a plurality of blocks block 0 to block y as indicated by 620 in FIG. 6A. Each of the blocks may Include a plurality of pages. The block may be set to a unit region by which programmed data can be erased, and the page may be set to a unit region by which data can be programmed and read.

Figure 6B:
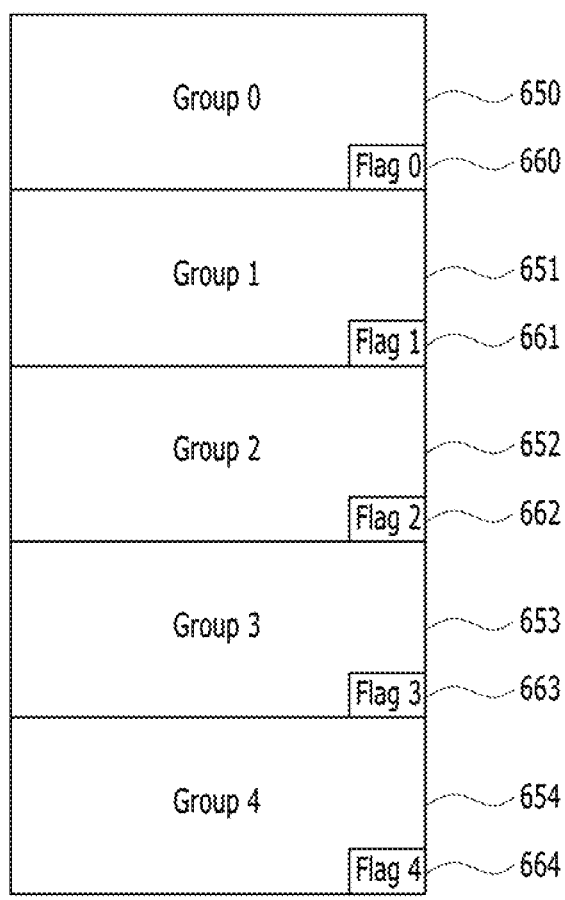

The block may include a plurality of groups group 0 to group n as indicated by 630 in FIG. 6A. Each of the groups may be set to a larger area than the page. As illustrated in FIG. 6B, each of the groups may include a flag cell capable of indicating whether the corresponding group is programmed. FIG. 6B illustrates an example in which one block 640 is divided into five groups including group 0 650 to group 4 654. In each of the groups group 0 to group 4, the flag cell may be applied to a preset position of the corresponding group. As illustrated in FIG. 66, the flag cell may be allocated to the last word line of the corresponding group. For example, the flag cell Flag 0 660 may be allocated to the last word line of the group 0 650, the flag cell Flag 1 661 may be allocated to the last word line of the group 1 651, the flag cell Flag 2 662 may be allocated to the last word line of the group 2 652 the flag cell Flag 3 663 may be allocated to the last word line of the group 3 653, and the flag cell Flag 4 664 may be allocated to the last word line of the group 4 654. In various embodiments, a block may be set to a search region, and the search region may be set to a unit region by which a read bias level can be adjusted.

The memory device 500 including the memory cell array illustrated in FIGS. 6A and 6B can adjust a read bias voltage for itself, or adjust a read bias voltage according to control of the controller 590.

In an embodiment, when a program command is received from the controller 590 of FIG. 5, the memory device 500 may program data to the respective groups of the block. When a group is completely programmed, the memory device 500 may set the flag cell of the group. For example, the memory device 500 may allocate the flag cell to the last word line of each group, and program the flag cell when the last word line is programmed. During a read operation, the memory device 500 may read all pieces of flag cell information after a currently read word line WL, and determine how many groups are programmed in the corresponding block (i.e., currently read block). Then, the memory device 500 may internally adjust the read bias voltage of the block, based on the determination result, and read memory cell information of a block corresponding to a read request, using the adjusted read bias voltage.

In an embodiment, the memory device 500 may include a flag cell read enable bit, and may set the flag cell read enable bit when the setting of the flag cell read enable bit is requested by the controller 590. When a read command is inputted in a state where the flag cell read enable bit is set, the memory device 500 may read the flag cell information of each group and check the program state of the corresponding block. Then, according to the checked program state, the memory device 500 may adjust the read bias voltage in order to read data of the corresponding block. When the memory device 500 internally changes the read bias voltage, the read bias voltage can be adjusted without changing the algorithm of a solution product (for example, SSD).

In an embodiment, the controller 590 may adjust the read bias voltage of the memory device 500. The controller 590 may recognize information related to an open block. When a read request for an open block is received, the controller 590 may control the memory device 500 to enable the flag cell read operation. Then, the memory device 500 may internally adjust the read bias based on the flag cell information. The controller 590 may control the memory device 500 to maintain the flag cell read enable state, until a read request for a closed block is made. When a read request for the closed block is made, the controller 590 may control the memory device 500 to disable the flag cell read operation.

Figure 7:
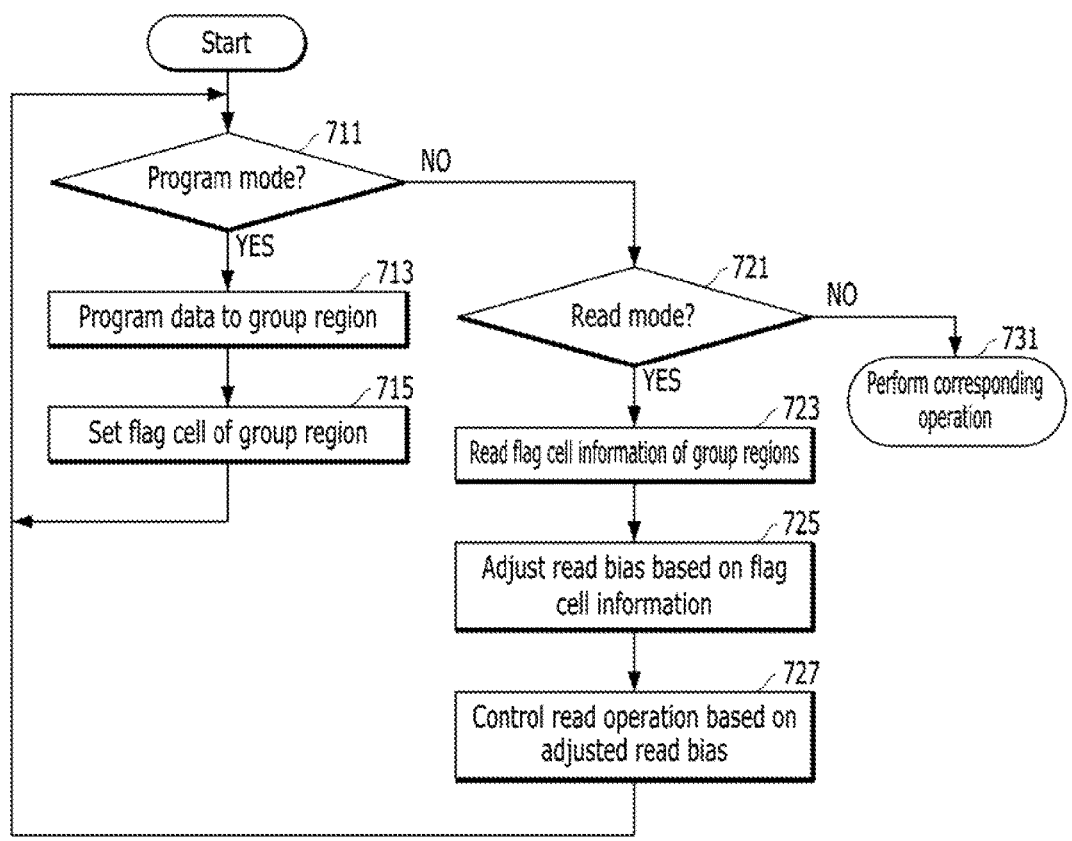
FIG. 7 is a flowchart illustrating an operation of programming and reading data in the memory system, in accordance with an embodiment of the present invention.

FIG. 7 is a flowchart illustrating an operation of the memory system, in accordance with an embodiment of the present invention.

Referring to FIG. 7, when it is determined at step 711 that the current mode is the program mode, the memory system may program data to a group region of the memory device at step 713. When the group region is completely programmed during the program operation, the memory system may program (i.e., set) the flag cell of the group region at step 715.

The memory system may adjust the read bias voltage of the memory device 500 based on the flag cell information in the read mode. When recognizing the read mode at step 721, the memory system may read the flag cell information of the group regions in the block at step 723, adjust a read bias voltage of a block to be read based on the read flag cell information at step 725, and read data of the corresponding block using the adjusted read bias voltage at step 727.

Depending on the amount (or state) of data written to a block of the memory device 500, the positions of cells may be changed. Thus, the read bias level may also be changed. For example, when the read bias voltage which is set based on the closed block is applied to an open block where data are partially written, a read fail may occur. The memory system in accordance with an embodiment may check the size (or amount) of data programmed in a block of the memory device 500, and adjust the read bias voltage of the corresponding block based on the checked size (or amount) of data programmed.

In an embodiment the memory system may divide the plurality of word lines included in the block into N groups, and set a flag cell only to one word line representative of each group (for example, the last word line of each group), the flag cell indicating the program state of the corresponding group. The representative word line in each of the word line groups may have an erase state at the initial stage. When data are programmed to the representative word line, information indicating that the corresponding group was completely programmed may be programmed to the flag cell of the group. When reading an open block, the memory system may first read the flag cell information (or values) of the representative word lines of the respective word line groups, and set a read bias voltage of the corresponding block based on the read flag cell information. For example, when performing a read operation on the open block, the memory system may adjust the read bias voltage in response to the position of a group checked as a group whose flag cell value corresponds to an erase state.

In accordance with an embodiment, the controller 590 of the memory system in FIG. 5 may check an open block in an open block list in the program mode, and control the memory device 500 to program data to a group of the open block of the memory cell array 540. At this time, when the data are completely programmed to the group, the memory device 500 may program the flag cell of the corresponding group. For example when the last word line of the group is completely programmed, the memory device 500 may program the flag cell allocated to the last word line of the corresponding group. When all of the groups of the block are completely programmed by repeating the above-described operation, that is, when the last group of the block is completely programmed, the controller 590 may set the corresponding block to a closed block, and then select an open block in the open block list in order to perform a program operation.

In accordance with an embodiment, the memory device 500 of the memory system may check the program states of the groups by reading the flag cells of the block in the flag cell read enable state, and generate the voltage control signal for controlling the read bias voltage based on the flag cell information. The voltage generator 520 of the memory device 500 may generate a read bias voltage for reading data of the corresponding block according to the voltage control signal.

In accordance with an embodiment, the controller 200 of the memory system may determine whether the corresponding block is an open block, in the read mode. When the corresponding block is an open block, the controller 200 may enable the flag cell read operation of the memory device 500, and control the memory device 500 to adjust the read bias voltage based on the flag cell information.

In an embodiment, the memory system may adjust and supply a read bias voltage based on whether a bock is a closed block or an open block. The memory system may supply a fixed read bias voltage to the closed block. The memory system may supply to the open block an adjusted read bias voltage which is adjusted according to the program state of data. The open block may include a block where data program is not completed. In accordance with an embodiment, the memory system may supply a fixed read bias voltage having a first voltage level to the closed block, and supply a read bias voltage having a second voltage level to the open block, the second voltage level being lower than the first voltage level. In accordance with an embodiment, the memory system may variably adjust the second voltage supplied to the open block, depending on the amount of data programmed in the block. The memory system may check the flag cell information of the open block, and adjust the read bias voltage of the open block based on the number of programmed flag cells (or the number of erased flag cells).

In an embodiment the memory system may generate a flag cell read command for controlling the memory device 500 to set a read bias voltage by analyzing flag cell information, during a read operation. The flag cell read command may include a command for controlling a read operation for the flag cells allocated to specific positions of the corresponding block. In accordance with an embodiment, the controller 590 may recognize region information of the groups in each of the blocks, and recognize the position information of the flag cells allocated to the respective groups. In this case, the controller 590 may search an open block and check the address of the block to be scanned by SP0. Then, the controller 590 may check the address information of the flag cells allocated to the open block, and transmit the address information with a read command to the memory device 500. In accordance with an embodiment, the memory device may recognize the address information of the flag cells allocated to the group regions of the respective blocks. In this case, when receiving the address information of an open block and the flag cell read command, the memory device 500 may read information of the flag cells allocated to the corresponding open block, and transmit the read information to the controller 590.

Figure 8:
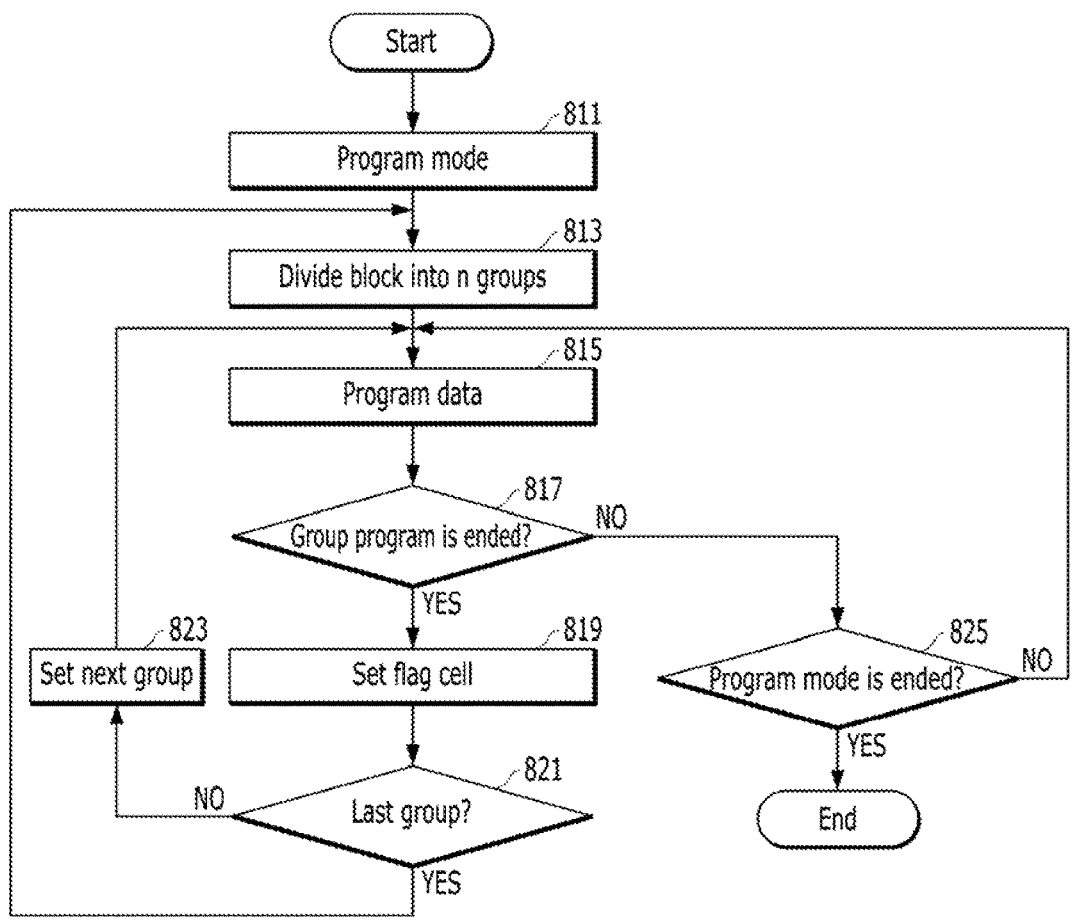
FIG. 8 is a flowchart illustrating an operation of programming data in the memory system, in accordance with an embodiment of the present invention.

FIG. 8 is a flowchart illustrating a program operation of a memory system, in accordance with an embodiment of the present invention.

Referring to FIG. 8, the memory system may perform a program operation in a program mode at step 811. When the program mode is requested, the memory system may check an open block in the open block list, divide the open block into a plurality of groups (e.g., n groups) and select at least one group of the open block to which data are to be programmed, at step 813. The memory system may program data to the selected group of the open block at step 815. When the selected group is completely programmed, the memory system may recognize the completion of the program for the selected group at step 817, and hence, may program the flag cell of the group at step 819. For example, when data are programmed to the last word line of the selected group, the memory system may set the flag cell allocated to the last word line of the selected group. After the flag cell is programmed, the memory system may check whether the selected group is the last group of the block, at step 821. When the selected group is not the last group, the memory system may proceed to step S823 to set the next group, and then return to step S815 to program data in the next group.

When the selected group is the last group at step 821, the memory system may proceed to step S813 to select the next open block, divide the open block into n groups, and then perform a data program operation. When an end of the program operation is requested while data are being programmed, the memory system may recognize the request and end the program operation, at step 825.

Figure 9:
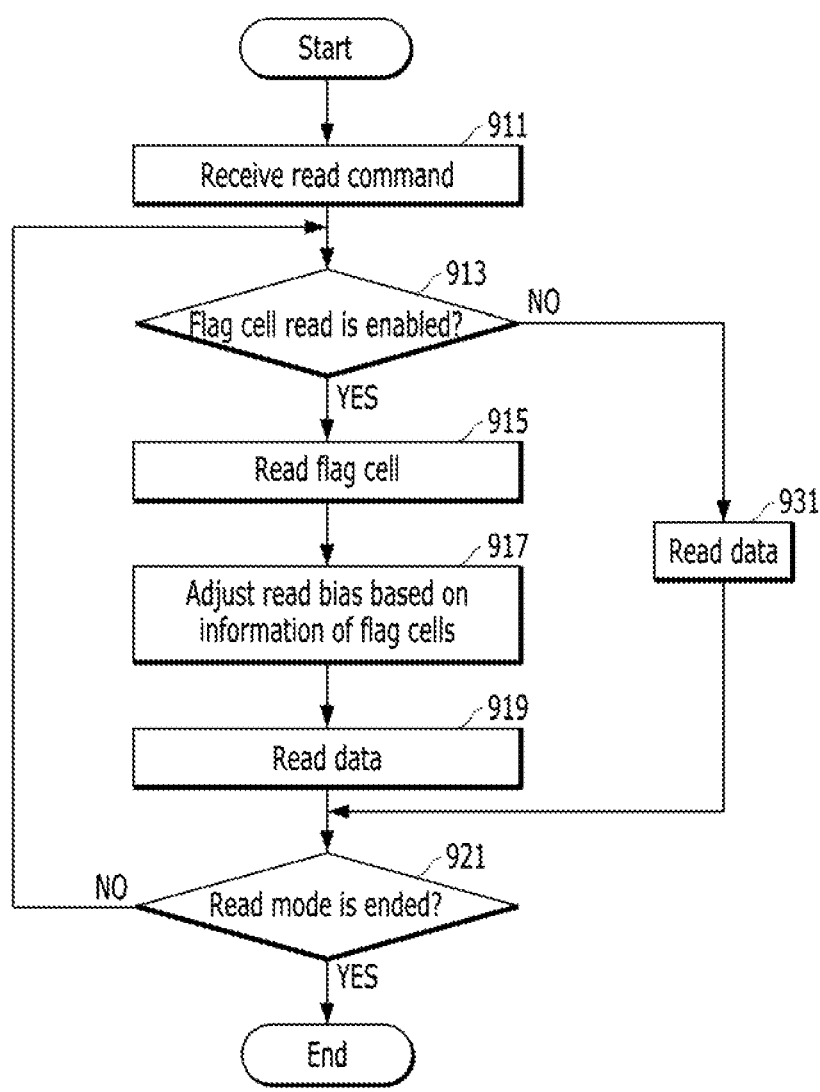
FIG. 9 is a flowchart illustrating an operation in which the memory device adjusts a read bias voltage in the memory system in accordance with an embodiment of the present invention.

FIG. 9 is a flowchart illustrating a read operation in the memory system, in accordance with an embodiment of the present invention. For example, FIG. 9 illustrates an operation in which the memory device of the memory system internally adjusts a read bias.

Referring to FIG. 9, when a read command is received from the controller at step 911, the memory device may check whether the flag cell read operation is enabled, at step 913. At this time, when the flag cell read operation is disabled, the memory device may recognize the state at step 913 and perform a data read operation using a default read bias voltage at step 931. For example, the state in which the flag cell read operation is disabled may indicate a read operation for a closed block. The default read bias voltage may include a voltage that is set when reading data of a closed block.

When the flag cell read operation is enabled, the memory device may read the flag cells of the groups of the block at step 915, and adjust the read bias voltage based on the read flag cell information, at step 917. At this time, the memory device may adjust the read bias voltage to a voltage that is proportional to the number of programmed cells. Alternatively, the memory device may adjust the read bias voltage to a preset voltage for example, a read bias voltage that is set when reading data of an open block. After adjusting the read bias voltage, the memory device may check whether an end of the read mode is requested, for example, whether a cancellation of the read command is requested, at step 921.

When an end of the read mode is not requested, the memory device may proceed to step S913 to perform a read operation. On the other hand, when an end of the read mode is requested, the memory device may recognize the request at step 921, and end the read operation.

In accordance with an embodiment, the memory device may adjust the read bias voltage itself. In this case, the word lines of the respective blocks included in the memory cell array of the memory device may be divided into n groups, and a flag cell may be allocated to the last word line of each group. When a group is completely programmed, the memory device may program the flag cell of the corresponding group. Then, when a read command is received from the controller, the memory device may read all of the flag cells after the currently read word line, and check how many groups are programmed in the currently read block, based on the information of the read flag cells. The memory device may adjust the read bias voltage of the current block based on the program state of the current block (for example, the number of programmed groups in the block). Furthermore, the memory device may read data of a block corresponding to a read request, using the adjusted read bias voltage.

Before performing a read operation, the memory device may set whether to read flag cell. For example, the memory device may include a flag cell read enable bit. When the flag cell read enable bit is set, the memory device may enable a flag cell read operation, and when the flag cell read enable bit is reset, the memory device may disable the flag cell read operation.

Figure 10A:
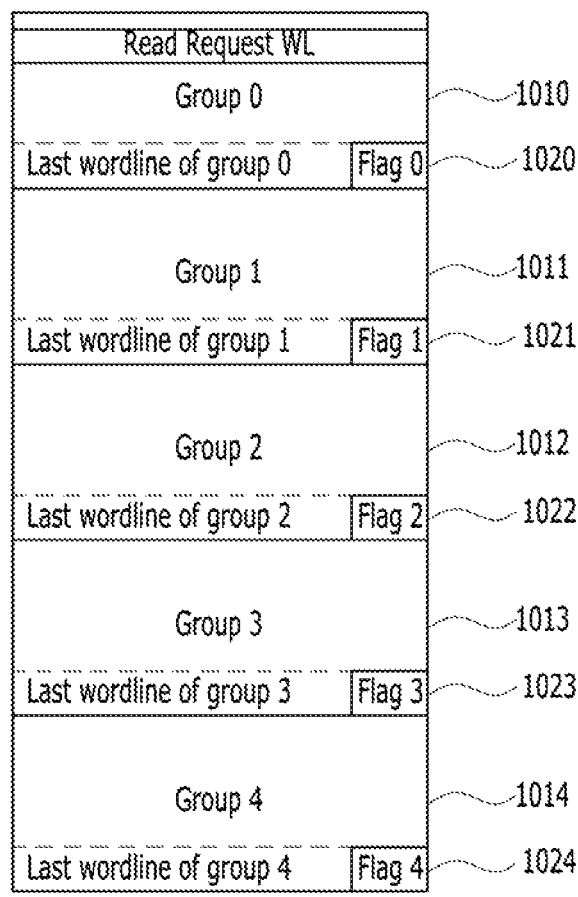
FIGS. 10A and 10B are diagrams illustrating a read operation which is performed according to the procedure illustrated in FIG. 9.
Figure 10B:
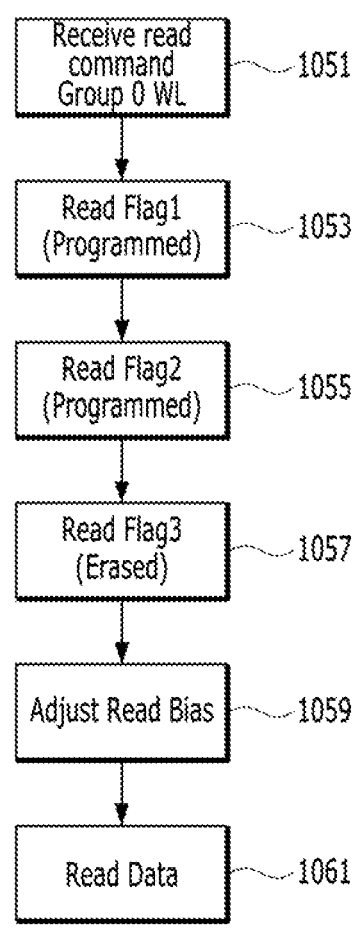

FIGS. 10A and 10B are diagrams illustrating an operation of adjusting a read bias voltage through the operation of FIG. 9.

FIG. 10A illustrates an example in which a block 640 is divided into five groups Group 0 1010 to Group 4 1014 and the flag cells 1020 to 1022 of the first to third groups Group 0 1010 to Group 2 1012 are programmed. That is, the third and fourth groups Group 3 1013 and Group 4 1014 among the five groups may not be programmed, and the flag cells 1023 and 1024 of the third and fourth groups among the five flag cells 1020, 1021, 1022, 1023 and 1024 may not be programmed.

Referring to FIG. 10B, when a read command is received (for example, when a read operation is performed in a state where the flag read enable bit is set), the memory device may read the flag cell of the groups of the block while performing steps 1051 to 1057. In the case of FIG. 10A, the memory device may recognize a state in which the flag cells 1020 to 1022 are programmed and the flag cell 1023 is not programmed. That is, the memory device may read flag cells from the point of time that a programmed flag cell is first recognized to the point, of time that a flag cell which is not programmed (i.e., erased flag cell) is recognized. The memory device may adjust the read bias voltage to a value corresponding to the group of the programmed last flag cell (the flag cell 1022 of the third group 1012 in FIG. 10A) at step 1059. The memory device may perform a data read operation using the adjusted read bias voltage at step 1061.

Figure 11:
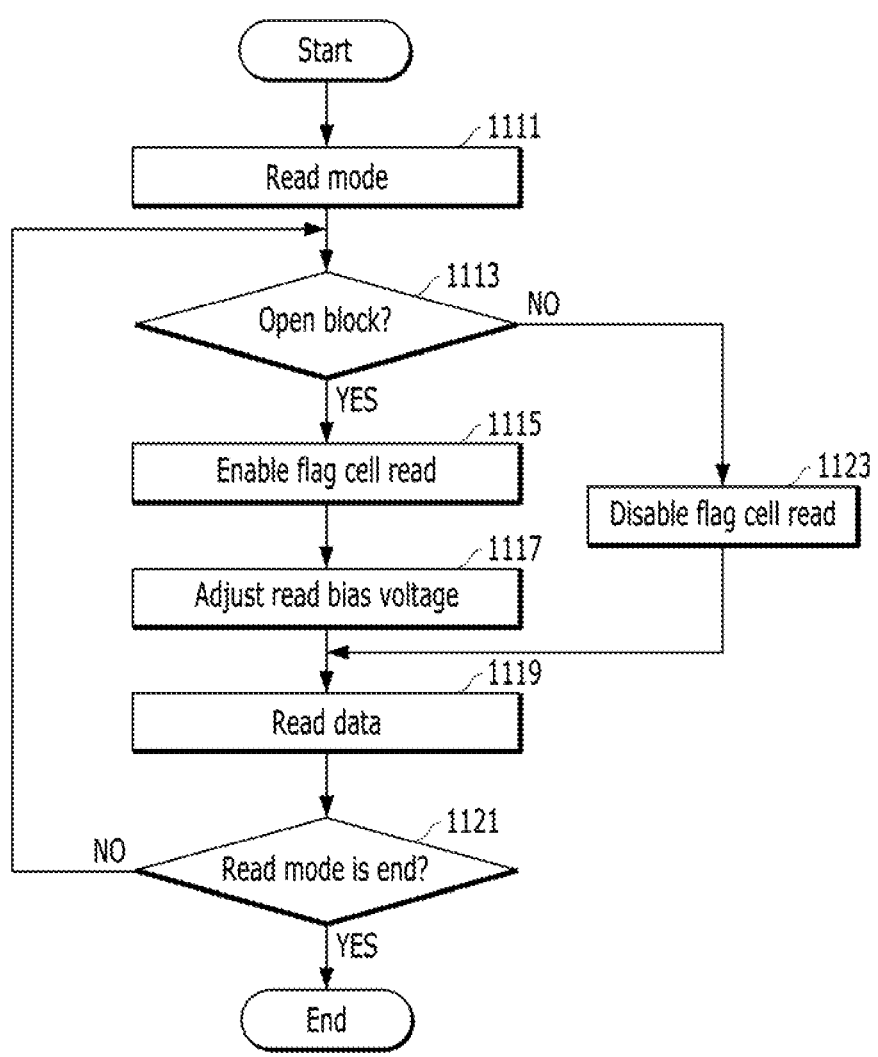
FIG. 11 is a flowchart illustrating an operation in which a controller controls a read bias voltage of the memory device in the memory system, in accordance with an embodiment of the present invention.

FIG. 11 is a flowchart illustrating a read operation of the memory system in accordance with the various embodiments. For example, FIG. 11 illustrates an operation in which the controller of the memory system controls a read bias adjusting operation.

Referring to FIG. 11, when a read operation of the memory device in a read mode is requested at step 1111, the controller may check whether a block corresponding to the read request is an open block, at step 1113. When the corresponding block is a closed block, the controller may transmit a flag cell read disable command to the memory device at step 1123, and control the memory device to perform a read operation on the closed block at step 1119. When the flag cell read disable command is received from the controller, the memory device may not perform a read operation for flag cell information, but perform a read operation on the memory cell array using the default read bias voltage.

On the other hand, when the block is an open block, the controller may recognize the open block at step 1113, transmit a flag cell read enable command to the memory device at step 1115, and control the memory device to adjust the read bias voltage at step 1117. Then, the controller may control the memory device to perform a read operation using the adjusted read bias voltage at step 1119. When the flag cell read enable command is received from the controller, the memory device may read the flag cells, and adjust the read bias voltage based on the read flag cell information. Then, the memory device may perform a read operation on the memory cell array using the adjusted read bias voltage.

When the read operation of the corresponding block is completed the controller may recognize the completion of the read operation, and check whether an end of the read mode is requested, at step 1121. When an end of the read mode is requested, the controller may end the read operation of the memory device. On the other hand, when an end of the read mode is not requested, the controller may proceed to step 1113 to check the state of the next block.

The controller of the memory system may recognize block information on an open block. When a read request for the open block is recognized in the read mode, the controller may control the memory device to enable the flag cell read operation. Then, the memory device may internally adjust the read bias voltage to perform a read operation. Then, when the read operation of the open block is ended, the controller may transmit the flag cell read disable command to the memory device. That is, when the read operation for the open block is ended, the controller may control the memory device based on a read operation of a closed block.

In accordance with another embodiment, the controller may read flag cell information through the memory device and adjust the read bias voltage of the memory device. When a read operation of the memory device is requested, the controller may check whether a block corresponding to the read request is an open block. When the corresponding block is a closed block, the controller may transmit the flag cell read disable command to the memory device, and control the memory device to perform a read operation of the closed block. On the other hand, when the corresponding block is an open block, the controller may transmit the flag cell read enable command to the memory device, and request information of the flag cell of the open block from the memory device. Then, the memory device may sequentially read the flag cells of the open block, and transmit the read information of the flag cells to the controller. When receiving the flag cell information, the controller may set a read bias voltage based on the received flag cell information. After setting the read bias voltage, the controller may transmit voltage control information of the set read bias voltage to the memory device. Then, the memory device may perform a read operation on the memory cell array using the adjusted read bias voltage.

In the memory system in accordance with various embodiments, the plurality of word ides may be divided into N groups, and a flag cell may be allocated to one word line representative of each group (for example, the last word line of each group), the flag cell indicating the program state of the corresponding group. For example, when a group is completely programmed, the memory system may set the flag cell allocated to the corresponding group. When an open block is read, the memory system may first check information (or values) of the flag cell of the representative word lines of the plurality of word line groups. Then, the memory system may adjust a read bias voltage based on the checked flag cell information. For example the memory system may adjust the read bias voltage in response to the position of a word line group of which the representative word line has a flag cell value corresponding to an erase state in the corresponding block, and read the data of the block using the adjust read bias voltage.

Hereinbelow, detailed descriptions will be made with reference to FIGS. 12 to 17, for a data processing system and electronic appliances to which the memory system 110 including the memory device 150 and the controller 130 described above with reference to FIGS. 1 to 11, according to the embodiment, is applied.

Figure 12:
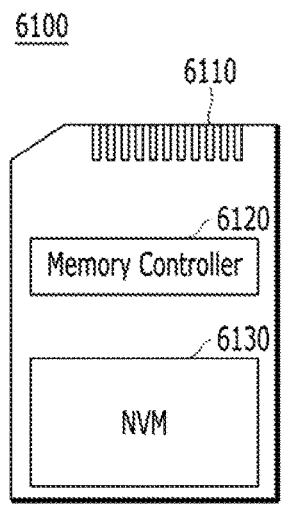
FIGS. 12 to 17 illustrate examples of a data processing system including the memory system, in accordance with various embodiments of the present invention.

FIG. 12 is a diagram illustrating a data processing system including the memory system according to the embodiment. For example, FIG. 12 illustrates a memory card system 6100 to which the memory system according to an embodiment is applied.

Referring to FIG. 12, the memory card system 6100 may include a memory controller 6120, a memory device 6130, and a connector 6110.

In detail, the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCI-e), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances for example, a mobile electronic appliance.

The memory device 6130 may be implemented with a nonvolatile memory (NVM). For example, the memory device 6130 may be implemented with one of various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (e.g., Personal Computer Memory Card International Association (PCM-CIA)) a compact flash card (CF) a smart media card (e.g., SM and SMC), a memory stick, a multimedia card (e.g., MMC, RS-MMC, MMCmicro and eMMC), an SD card (e.g., SD, miniSD microSD and SDHC) and a universal flash storage (UFS).

Figure 13:
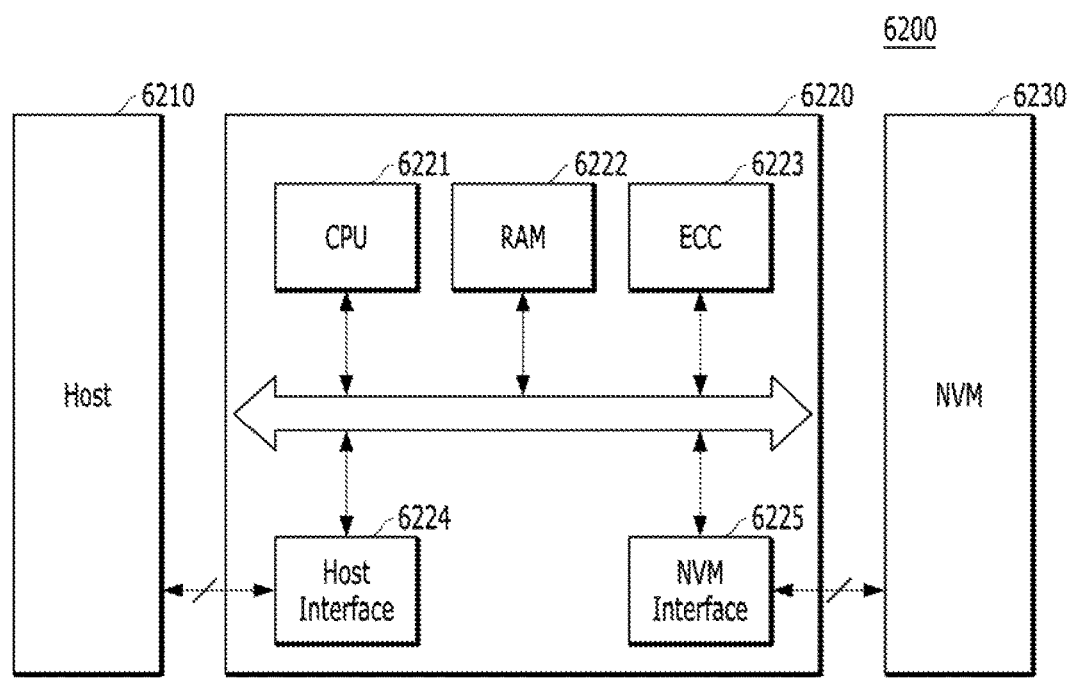

FIG. 13 is a diagram schematically illustrating another example of a data processing system 6200 including a memory system according to an embodiment of the present invention.

Referring to FIG. 13, the data processing system 6200 may include a memory device 6230 which may be implemented with at least one nonvolatile memory (NW) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include at least one of a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 may correspond to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time the ECC circuit 6223 may correct errors by using the parity bits. For example, as described above with reference to FIG. 1, the ECC circuit 6223 may correct errors by using one of various coded modulations such as a low density parity check (LDPC) code, a Bose-Chaudhuri-Hocguenghem (BCH) code, a turbo code, a Reed-Solomon (RS) code, a convolution code, a recursive systematic code (RSC), a trellis-coded modulation (TCM) and a Block coded modulation (BCM).

The memory controller 6220 may transmit and receive data to and from the host 6210 through the host interface 6224, and transmit and receive data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCI-e) or a NAND interface. Further, as a wireless communication function or a mobile communication protocol such as wireless fidelity (WI-FI) or long term evolution (LTE) is implemented, the memory controller 6220 may transmit and receive data by being connected with an external device such as the host 6210 or another external device other than the host 6210. For example, as the memory controller 6220 is configured to communicate with an external device through at least one among various communication protocols, the memory system and the data processing system according to the embodiment may be applied to wired/wireless electronic appliances, for example a mobile electronic appliance.

Figure 14:
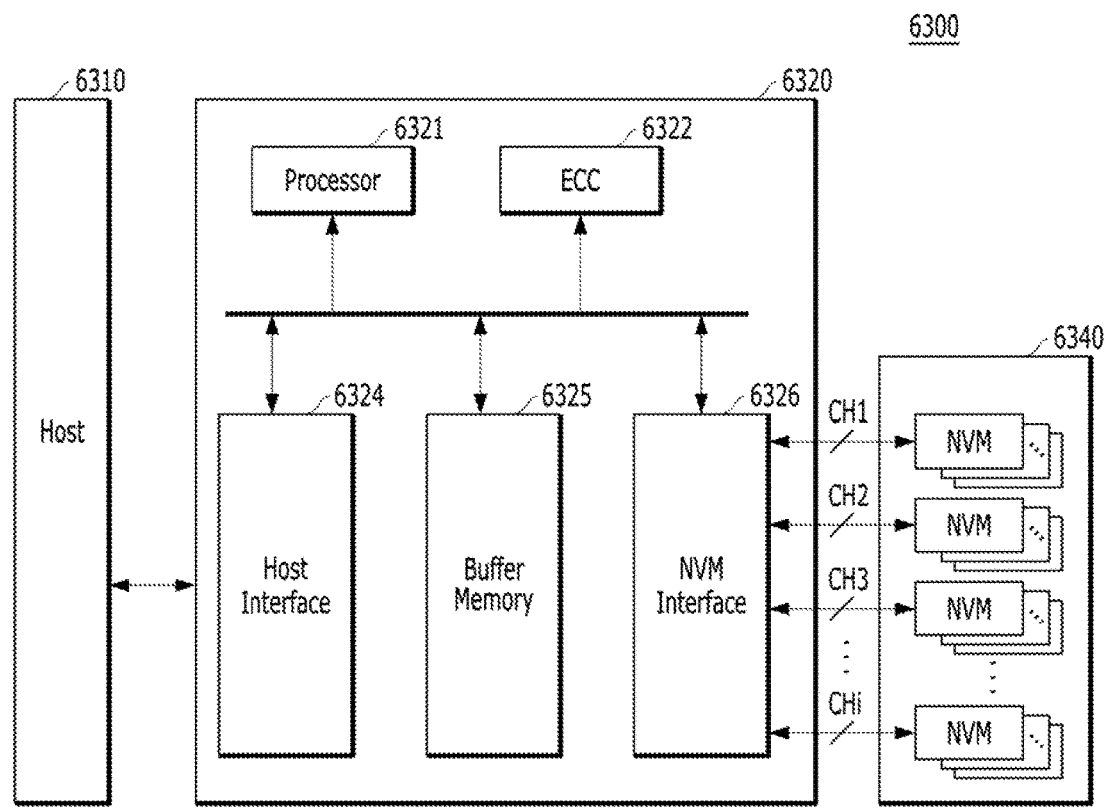

FIG. 14 is a diagram illustrating another example of a data processing system including a memory system according to an embodiment of the invention. For example, in FIG. 14, a solid state drive (SSD) 6300 employing a memory system is shown.

Referring to FIG. 14, the SSD 6300 may include a memory device 6340 which may include a plurality of nonvolatile memories NVM, and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

In detail, the controller 6320 may be connected with the memory device 6340 through a plurality of channels CH1, CH2, CH3, . . . and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 may temporarily store data received from a host 6310 or data received from a plurality of nonvolatile memories NVMs included in the memory device 6340, or temporarily store metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 10, for the sake of convenience in explanation, that the buffer memory 6325 is disposed inside the controller 6320, it is to be noted that the buffer memory 6325 may be disposed outside the controller 6320.

The ECC circuit 6322 may calculate error correction code values of data to be programmed in the memory device 6340 in a program operation, perform an error correction operation for data read from the memory device 6340, based on the error correction code values, in a read operation, and perform an error correction operation for data recovered from the memory device 6340 in a recovery operation for failed data.

The host interface 6324 may provide an interface function with respect to an external device such as the host 6310. The nonvolatile memory interface 6326 may provide an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (for example at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (for example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 15:
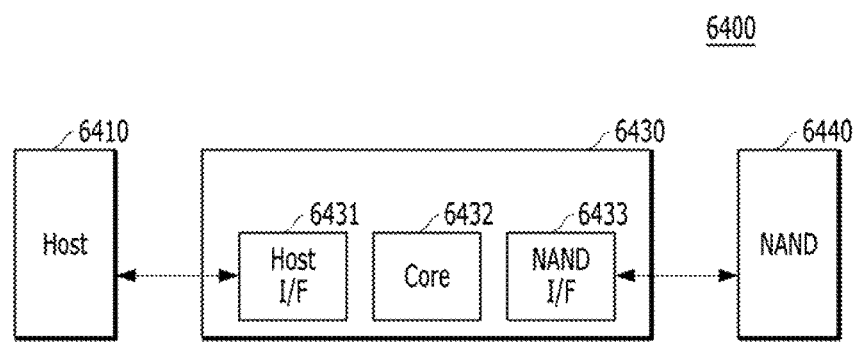

FIG. 15 is a diagram illustrating another example of a data processing system including the memory system according to an embodiment of the present invention. For example, in FIG. 15, an embedded multimedia card (eMMC) 6400 employing a memory system is shown.

Referring to FIG. 15, the eMMC 6400 may include a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

The controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430.

For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 16:
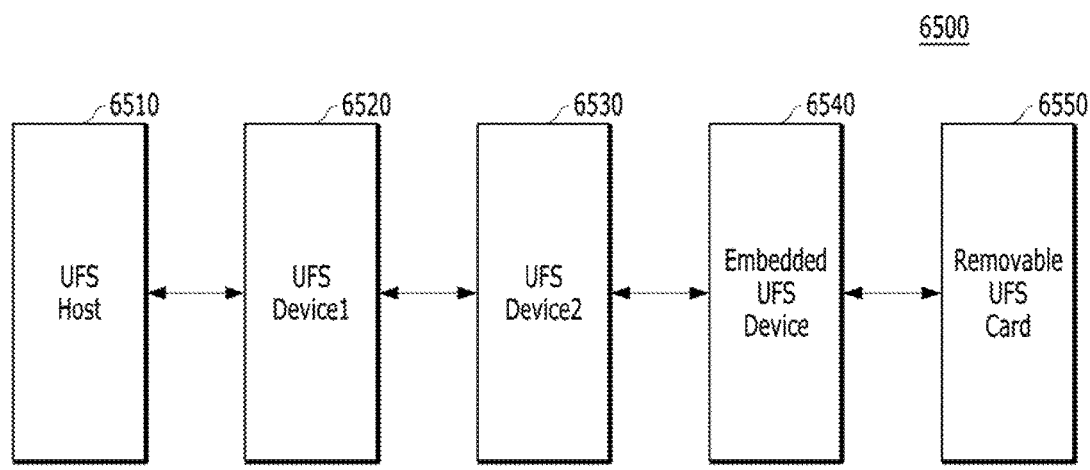

FIG. 16 is a diagram illustrating another example of a data processing system including a memory system according to an embodiment of the present invention. For example, FIG. 16 is a drawing schematically illustrating a universal flash storage (UFS) to which the memory system according to the embodiment is applied.

Referring to FIG. 16, the UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 8. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 17:
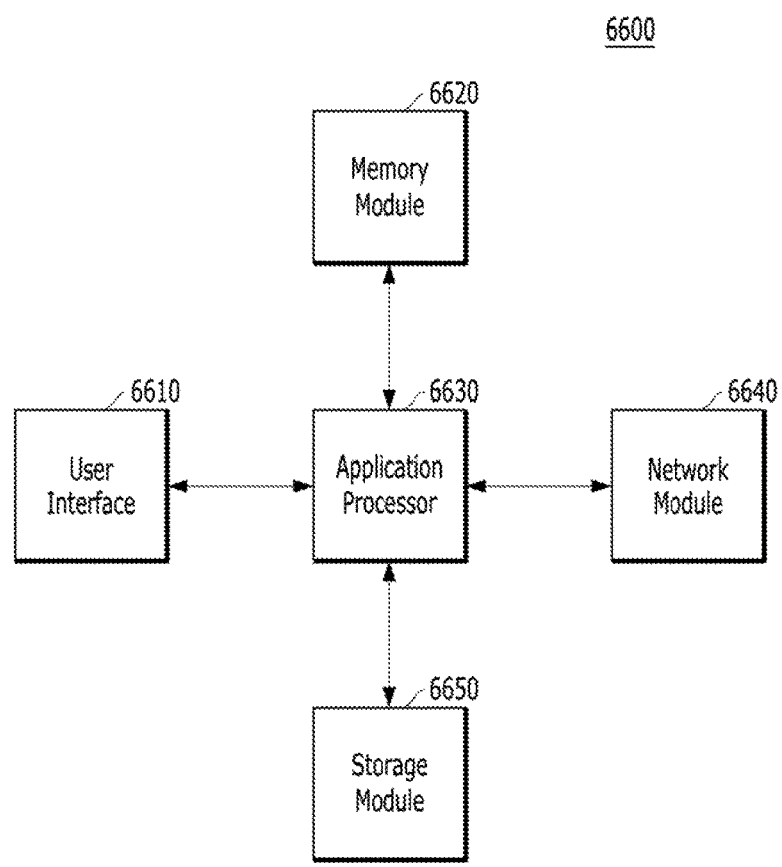

FIG. 17 is a diagram illustrating another example of a data processing system including the memory system according to an embodiment of the present invention. For example, in FIG. 17, a user system 6600 employing the memory system is shown.

Referring to FIG. 17, the user system 6600 may include a user interface 6610, a memory module 6620, an application processor 6630, a network module 6640, and a storage module 6650.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic appliances, for example, a mobile electronic appliance. Accordingly, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be implemented by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 14 to 16.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

In accordance with the various embodiments, the memory system and the operating method thereof can set the read bias voltage level which is optimized in the memory device depending on the data storage states of the plurality of memory blocks, thereby minimizing an occurrence of read fails. Furthermore, the controller for controlling the memory device may search for a block of the memory device in the read mode, and control the memory device to read data of the block using the optimized read bias voltage, when the block is an open block.

Although various embodiments have been described for illustrative purposes, it will be apparent to those skilled in the art that various changes and modifications may be made without departing from the spirit and scope of the invention as defined in the following claims.

What is claimed is:
1. A memory device comprising:
a memory cell array comprising a plurality of search regions, each of the search regions comprising a plurality of group regions, each of the group regions comprising a flag cell, each flag cell comprising information indicating whether the corresponding group region is programmed;
a voltage generator suitable for generating a read bias voltage for the memory cell array according to a voltage control signal; and
a memory controller suitable for selecting a search region among the plurality of search regions when a read command is received and controlling the voltage generator to adjust the read bias voltage based on information of flag cells included in the selected search region, and controlling a read operation for the selected search region based on the adjusted read bias voltage,
wherein the memory controller determines a number of programmed group regions in the selected search region based on the information of the flag cells included in the selected search region, and controls the voltage generator to adjust the read bias voltage based on the number of programmed group regions in the selected search region.
2. The memory device of claim 1, wherein the search region of the memory cell array is a block, the block comprises a plurality of group regions, and each of the group regions has a larger area than a page.
3. The memory device of claim 2, wherein the flag cell is positioned at the last word line of the corresponding group region.
4. The memory device of claim 2, wherein when the corresponding group region is completely programmed, the memory controller sets the flag cell of the corresponding group region.
5. The memory device of claim 4, wherein when a read command is received, the memory controller reads flag cells of the group regions of a block corresponding to the read command, checks cell distribution of the corresponding block based on information of the read flag cells, and generates the voltage control signal to adjust the read bias voltage to a read bias voltage corresponding to the checked cell distribution,
wherein the memory controller determines the number of programmed group regions in the selected search region by reading the flag cells of group regions included in the selected search region after a group region corresponding to the read command.
6. The memory device of claim 1, wherein the memory controller comprises a flag cell read enable bit, and checks the flag cell read enable bit when the read command is inputted,
wherein when a flag cell read operation is enabled, the memory controller reads the flag cell of the group regions of the block corresponding to the read command, and generates the voltage control signal for adjusting the read bias voltage based on information of the read flag cell, and
when the flag cell read operation is disabled, the memory controller generates a voltage control signal for a default read bias voltage.

7. A memory system comprising:
a memory device; and
a controller coupled to the memory device, and suitable for enabling a flag cell read operation for an open block of the memory device during a read mode,
wherein the memory device comprises:
a memory cell array comprising a plurality of search regions, wherein each of the search regions comprises a plurality of group regions, and each of the group regions comprises a flag cell indicating whether program is completed;
a voltage generator suitable for generating a read bias voltage for the memory cell array according to a voltage control signal; and
a memory controller suitable for checking that a flag cell read operation is enabled when a read command is received, generating the voltage control signal for an adjusted read bias voltage based on flag cell information of the corresponding search region among the plurality of search regions when the flag cell read operation is enabled, and controlling a read operation for the memory cell array based on the adjusted read bias voltage,
wherein the memory controller selects a search region among the plurality of search regions when the read command is received;
determines a number of programmed group regions in the selected search region based on the information of the flag cells included in the selected search region; and
controls the voltage generator to adjust the read bias voltage based on the number of programmed group regions in the selected search region.

8. The memory system of claim 7, wherein the search region is a block, the block comprises a plurality of group regions, and the flag cell is positioned at the last word line of the corresponding group region.

9. The memory system of claim 8, wherein when the corresponding group region is completely programmed, the memory controller sets the flag cell of the corresponding group region.

10. The memory system of claim 9, wherein the controller disables the flag cell read operation for a closed block of the memory device, and
the memory controller outputs a voltage control signal for generating a default read bias voltage to the voltage generator when the flag cell read operation is disabled.

11. An operating method of a memory device which includes a memory cell array including a plurality of search regions, wherein each of the search regions comprises a plurality of group regions and each of the group regions comprises a flag cell indicating whether the corresponding group region is programmed, the operating method comprising:
receiving a read command;
adjusting a read bias voltage of a corresponding search region, based on flag cell information of the group regions of the search region; and
controlling a read operation for the memory cell array based on the read bias voltage,
wherein the adjusting of the read bias voltage includes:
selecting a search region among the plurality of search regions when the read command is received;
determining a number of programmed group regions in the selected search region based on the information of the flag cells included in the selected search region; and
adjusting the read bias voltage based on the number of programmed group regions in the selected search region.

12. The operating method of claim 11, wherein the search region is a block, the block includes a plurality of group regions, and the flag cell is positioned at the last word line of the group region.

13. The operating method of claim 11, further comprising programming data,
wherein the programming of the data comprises:
programming data to a corresponding group region when a program command is received; and
setting the corresponding flag cell when the corresponding group region is completely programmed.

14. The operating method of claim 13, wherein the adjusting of the read bias voltage comprises:
reading flag cell information of the groups of a block corresponding to the read command;
checking the program state of the corresponding block based on the read flag cell information; and
adjusting the read bias voltage to a read bias voltage corresponding to the program state of the block.

15. The operating method of claim 14, further comprising checking whether a flag cell read operation is enabled, when the read command is received,
wherein when the flag cell read operation is enabled, the read bias voltage is adjusted based on the corresponding flag cell information.

16. The operating method of claim 15, further comprising generating a default read bias voltage when the flag cell read operation is disabled.

17. The operating method of claim 11, further comprising:
checking block information during a read mode, enabling a flag cell read operation for an open block of the memory device, and generating a read command,
wherein the adjusting of the read bias voltage of a corresponding search region comprises generating the read bias voltage which is adjusted based on the flag cell information, when the read command is generated and the flag cell read operation is enabled.

18. The operating method of claim 17, wherein the search region is a block, the block includes a plurality of group regions, and the flag cell is positioned at the last word line of the corresponding group region.

19. The operating method of claim 18, further comprising programming data,
wherein the programming of the data comprises:
programming data to a corresponding group region when a program command is received; and
setting the flag cell when the corresponding group region is completely programmed.

20. The operating method of claim 19, wherein the checking of the block information comprises disabling the flag cell read operation for a closed block of the memory device, and
the generating of the read bias voltage comprises generating a preset default bias voltage of the closed block.

* * * * *